(12) United States Patent
Fechner et al.

(10) Patent No.: US 6,300,666 B1
(45) Date of Patent: Oct. 9, 2001

(54) METHOD FOR FORMING A FRONTSIDE CONTACT TO THE SILICON SUBSTRATE OF A SOI WAFER IN THE PRESENCE OF PLANARIZED CONTACT DIELECTRICS

(75) Inventors: Paul S. Fechner, Plymouth; Gregory D. Dougal; Keith W. Golke, both of Minneapolis, all of MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/163,687

(22) Filed: Sep. 30, 1998

(51) Int. Cl.$^7$ .................................................. H01L 29/00
(52) U.S. Cl. ............................................ 257/503; 257/621
(58) Field of Search ............................... 257/41, 164, 181, 257/276, 299, 347, 350, 355, 457, 459, 503, 621, 629, 688, 901

(56) References Cited

U.S. PATENT DOCUMENTS

| 4,549,927 | 10/1985 | Goth et al. . | |
|---|---|---|---|
| 4,873,204 | * 10/1989 | Wong et al. | 438/649 |
| 5,079,605 | 1/1992 | Blake . | |
| 5,314,841 | 5/1994 | Brady et al. . | |
| 5,445,988 | * 8/1995 | Schwalke | 438/432 |
| 5,565,236 | 10/1996 | Gambino et al. . | |
| 5,574,298 | 11/1996 | Hashimoto et al. . | |
| 5,610,083 | 3/1997 | Chan et al. . | |
| 5,814,848 | * 9/1998 | Oshima | 257/210 |
| 5,945,712 | * 8/1999 | Kim | 257/347 |
| 6,002,154 | * 7/1998 | Fujita | 257/349 |

* cited by examiner

Primary Examiner—Stephen D. Meier
Assistant Examiner—Jeff Vockrodt
(74) Attorney, Agent, or Firm—Kris T. Fredrick

(57) ABSTRACT

A method for forming a frontside substrate contact on a Silicon-On-Insulator wafer in the presence of planarized contact dielectric is described. The method offers the improvement of reducing the etch selectivity requirements while allowing simultaneous etching and metallization of gate, source, drain and substrate contacts.

17 Claims, 1 Drawing Sheet

METHOD FOR FORMING A FRONTSIDE CONTACT TO THE SILICON SUBSTRATE OF A SOI WAFER IN THE PRESENCE OF PLANARIZED CONTACT DIELECTRICS

CROSS REFERENCE TO RELATED APPLICATIONS

Not applicable.

U.S. GOVERNMENT RIGHTS

Not applicable.

BACKGROUND OF THE INVENTION

1. Field of the Invention

The present invention relates generally to device processing of Silicon-On-Insulator (SOI) wafers, and more particularly, relates to a method of forming a frontside contact to the silicon substrate of a SOI wafer.

2. Description of the Prior Art

SOI Technology has been shown to provide many advantages over bulk silicon technology. These advantages include higher speed, lower power and resistance to certain forms of radiation.

In many applications it is desirable to ground or bias the bottom substrate of a SOI circuit. In order to make an electrical connection at the backside of the wafer it requires additional wafer processing. In most of the more advanced packaging technologies such as flip chip and die stacking, making a connection to substrate silicon via the back of the die is cost prohibitive. Therefore, connecting the substrate to a standard topside metallization pad is necessary. However, the challenge of forming this contact during normal processing flow without adding major requirements to the standard processes without this topside contact is significant. This is especially true in the presence of highly planarized contact dielectric processes (i.e. Chemical Mechanical Polishing (CMP) and photoresist planarized contacts) required for today's deep submicron lithography where the thickness of the contact dielectric over the substrate contact may be in the range of 0.2 to 1.0 micron more than the thickness over the thickest region in the normal circuit area, which would typically be the source/drain contact areas. Scaling designs into the deep submicron range normally requires a high degree of planarity in the contact dielectric in order to be able to lithographically define contact and metal interconnect layers. Even without a frontside contact to the substrate, the selectivity of the contact etch is already required to be quite high. In the prior art, in order to make simultaneous contact to gate polysilicon, source and drain regions, and the underlying substrate, the selectivity of contact etch to gate polysilicon must be increased significantly in order to be able to etch the planarized contact dielectric all the way down to the silicon substrate.

Brady, et al, in U.S. Pat. No. 5,314,841, "Method of Forming a Frontside Contact to the Silicon Substrate of a SOI Wafer" describes a frontside contact formation process. This prior art has the weakness of increasing the etch selectivity requirements of the process significantly when compared to a process that does not include the frontside substrate contact.

It is therefore an object of the present invention to provide a frontside substrate contact without significantly increasing the selectivity requirements of the etch of the planarized contact dielectric.

It is another object of the present invention to teach a simple method to create a sloped oxide edge using reflowed photoresist with an oxide etch non-selective to photoresist.

BRIEF SUMMARY OF THE INVENTION

The present invention solves these and other needs by providing a method which both forms the substrate contact as part of the normal processing sequence without exposing the substrate silicon to the gate etch and uses a local interconnect to raise said substrate contact to a level above the source/drain areas prior to depositing the contact dielectric. It is assumed in the process flow stated below that the top silicon is removed at some time prior to Step 2.

1. Proceed with standard device processing steps up through gate etch.
2. Define a substrate contact region with photoresist.
3. Bake the photoresist to create a positive edge profile.
4. Etch a hole or trench down to the substrate through the exposed hole in the photoresist.
5. Remove the photoresist and continue with normal processing.
6. Cover the substrate contact region while implanting a dopant of the opposite type as the substrate.
7. Open the substrate contact region while implanting a dopant of the same type as the substrate.
8. Open the substrate contact region for normal silicidation.
9. Deposit and define a local interconnect from the silicide region within the substrate contact region up to the top of the oxide layers.
10. Deposit and planarize a contact dielectric.
11. Within normal metalization processing, etch through the planarized contact dielectric down to the top end of the local interconnect, as well as the source, drain, and gate contact locations.

DETAILED DESCRIPTION OF THE INVENTION

The first requirement is the removal of the top silicon of the SOI wafer in the site where the frontside contact is to be formed. Most SOI technologies remove the silicon from some portion of the wafer either by etching or by oxidizing the silicon to form a field oxide. In the process described in the preferred embodiment of the present invention, it is assumed that the silicon was removed at some earlier process step via Reactive Ion Etching (RIE) that is selective to the buried oxide, and that a field oxide similar to that used for Shallow Trench Isolation (STI) is deposited above the buried oxide layer.

Figure 1:
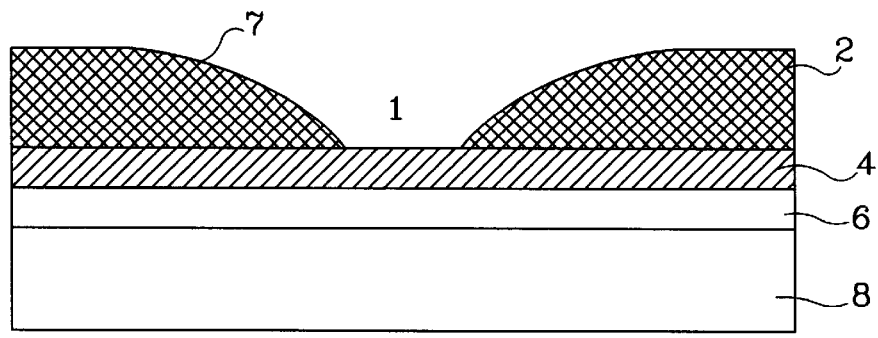
FIG. 1 is a cross sectional view of the placement of photoresist defining the substrate contact site on the SOI wafer after reflow of said photoresist.

It can be seen in FIG. 1 that there now exists a wafer consisting of a field oxide layer 4 over a buried oxide layer 6 over a silicon substrate 8. Defining material 2 is placed on the top surface of the field oxide 4 to define the region 1 where the topside contact is to be placed. In the preferred embodiment, the defining material 2 is in the form of a photoresist mask, and will be referred to as such from this point forward. The wafer is baked to cause a partial reflow of the photoresist 2, giving it the positive edge profile 7. A positive edge profile means that, when the edge is viewed in a cross-sectional profile view, the profile is either strictly increasing or strictly decreasing. Relating this in mathematical terms, if the profile was thought of as being the plot of a function, it could be referred to as being a monotonic function.

Figure 2:
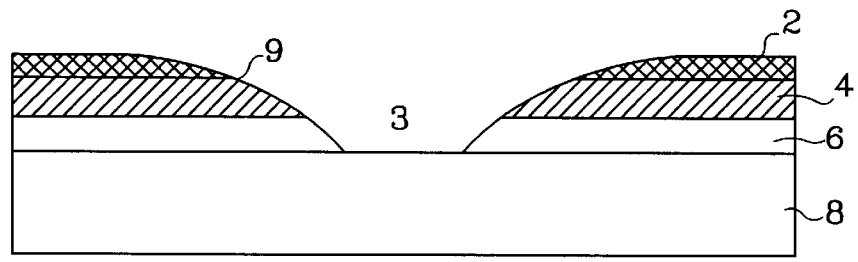
FIG. 2 is a cross sectional view of the wafer after oxide etching.

A hole or trench 3 is then etched down through the oxide layers 4 and 6 to the substrate 8 through the opening in the photoresist 2 as shown in FIG. 2. This hole or trench can be used for STI between adjacent active devices on the wafer. While this could be done with a wet etch, a Reactive Ion Etch is used in order to maximize size and edge profile control. This is especially needed in the presence of a Chemical Vapor Deposition (CVD) STI top field oxide layer 4 which can wet etch at a much higher rate than the underlying buried oxide layer 6. The positive edge profile 9 needed in order to be able to create a connection later from the substrate contact point up to the top of the field oxide 4 is created through the combination of the aforementioned high temperature bake of the photoresist 2, typically in the 155–190 degree C. temperature range, and a RIE in which the oxide to photoresist selectivity is adjusted to transfer the positive slope (smoothed from the bake) of the photoresist edge 7 downward into the oxide layers 4 and 6. Oxide to photoresist etch rates of 1–2:1 are preferred but higher selectivity may be used depending upon the photoresist reflow profile and the desired step coverage of the local interconnect.

Most RIE chemistries that are non-selective to photoresist are also non-selective to silicon. Therefore, the non-selective RIE should not be carried all the way down to the silicon substrate 8. It is desirable to maintain the non-selective etch as long as possible before switching to a highly selective etch. An isotropic last step (either wet or dry) is preferred to ensure the etch profile remains positive all the way to the top. It should be noted that the original photoresist 2 must be thick enough to not be consumed by the RIE, and to protect the underlying circuitry from wet etch if used. The exact location of the previous step in the process flow is quite flexible, but it should be placed before P-channel source/drain implant cut and implant (assuming a P-type substrate), and either after gate etch or before gate oxidation so as to avoid any attack of the substrate silicon 8 by the gate polysilicon over etch.

Figure 3:
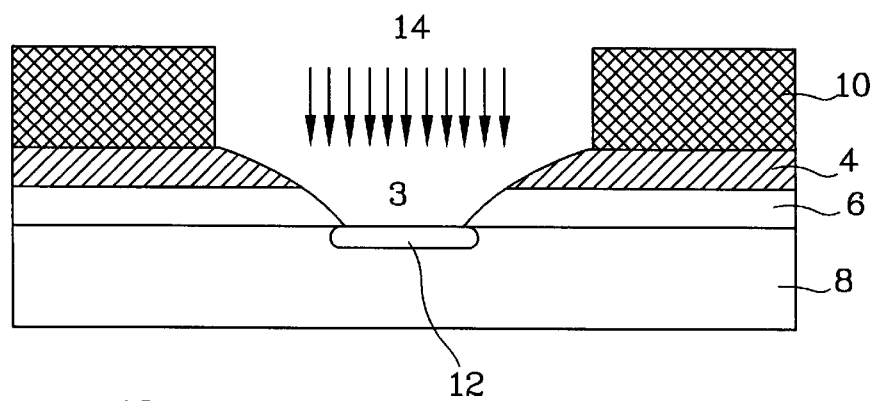
FIG. 3 is a cross sectional view of the doping taking place in the substrate contact site.

Alternatively an RIE etch which creates a sufficiently positive profile in field oxide 4 and buried oxide 6 could be used in lieu of the previously described photoresist reflow. In a manner consistent with a standard process flow, the substrate contact site 3 is left uncovered by photoresist 10 as in FIG. 3 when implanting a dopant 14 of the same type as the substrate 8, but is covered by photoresist (not shown) when implanting a dopant of the opposite type as the substrate 8. The result is a doped region 12 of the same type as the substrate 8 in the substrate contact site 3.

Figure 4:
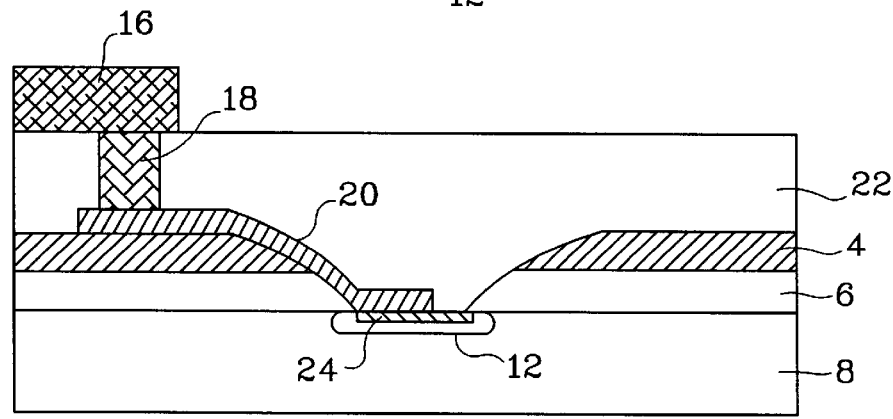
FIG. 4 is a cross sectional view of the final topside substrate contact after silicidation, local interconnect processing, contact dielectric planarization, and metallization.

The silicidation of the substrate contact, gate, source and drain can all be made simultaneously in a commonly known manner. In FIG. 4, the silicide 24 can be seen in the doped region 12. A local interconnect layer 20, common to many advanced CMOS submicron processes, is then placed to route the connection to the substrate 8 along the positive edge profile 9 of buried oxide layer 6 and field oxide layer 4 up to the top of the field oxide layer 4, placing it at a level typically somewhere between source, drain and gate polysilicon (not shown). This eliminates the need for any changes (i.e. increased etch selectivity) in over etch of the planarized contact dielectric 22 relative to a process without the substrate contact. Planarized contact dielectric 22 may be of a variety of oxides, for example, phosphorous-doped silicon dioxide (P-glass) borophosphosilicate glass (BPSG), or high density plasma (HDP) which has been planarized by a CMP process. Local interconnects have typically been used for very short routing connections to source drain and gate. Local interconnects usually have a self-aligned contact capability which improve density. Local interconnect 20 may be formed using various silicides, for example, titanium silicide ($TiSi_2$). In one method, a titanium amorphous silicon layer is deposited and the amorphous silicon is defined. The amorphous silicon is then reacted with the titanium to form the titanium silicide local interconnect. The forming of the local interconnect can be part of the salicide process itself or it can be a separate process performed after salicidation. A variety of methods including simply depositing titanium silicide or titanium nitride could be used to form the local interconnect of the present invention. In a commonly known manner, a metallized contact is formed including a contact plug 18 typically formed of tungsten and contact trace 16 which is typically aluminum.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A frontside contact to the substrate of a SOI wafer comprising:

a silicon substrate;

a stack of at least one buried insulative layer and a device level silicon layer, wherein the buried insulative layer is formed on said silicon substrate and said device level silicon layer is formed over said buried insulative layer, such that said buried insulative layer is in contact with said silicon substrate and said device level silicon layer is above said buried insulative layer;

a first void having side edges and extending through said stack, exposing a portion of said silicon substrate, and at least a portion of said side edges of said first void having a positive profile;

a conductive member having a point of contact at said exposed portion of said silicon substrate and extending across said positive profile;

an insulative contact layer formed over said stack, filling said first void;

a second void formed through said insulative contact layer, exposing a portion of the conductive member; and a conductive contact formed through said second void to said conductive member.

2. The frontside contact of claim 1, wherein said stack comprises a field oxide layer.

3. The frontside contact of claim 1, wherein said conductive member comprises a local interconnect.

4. The frontside contact of claim 1, wherein said silicon substrate has a dopant type, and wherein the frontside contact further comprises:

a region of doped semiconductor of the same dopant type as said silicon substrate within a surface of said silicon substrate.

5. The frontside contact of claim 4, further comprising:

a region of silicide in contact with said region of doped semiconductor.

6. A semiconductor device having a direct substrate frontside contact comprising:

a substrate;

a first insulative layer formed on a surface of the substrate;

a device level layer formed over the first insulative layer, corresponding portions of the first insulative layer and the device level layer having a positive profile;

a conductor formed along the positive profile, the conductor being in contact directly with the surface of the substrate;

a second insulative layer formed over the conductor; and, a contact extending through the second insulative layer to the conductor.

7. The semiconductor device of claim 6 wherein the substrate comprises a silicon substrate.

8. The semiconductor device of claim 6 wherein the first insulative layer comprises an oxide layer.

9. The semiconductor device of claim 6 wherein the device level layer comprises a silicon device level layer.

10. The semiconductor device of claim 6 further comprising a field layer above the first insulative layer.

11. A semiconductor device comprising:

a substrate;

a first insulative layer formed over the substrate;

a device level layer formed over the first insulative layer;

overlying voids through the device level layer and the first insulative layer thereby exposing a portion of the substrate;

a conductor extending through the voids so as to be in contact with the exposed portion of the substrate;

a second insulative layer formed over the conductor; and, a contact extending through the second insulative layer to the conductor.

12. The semiconductor device of claim 11 wherein the substrate comprises a silicon substrate.

13. The semiconductor device of claim 11 wherein the first insulative layer comprises an oxide layer.

14. The semiconductor device of claim 11 wherein the device level layer comprises a silicon device level layer.

15. The semiconductor device of claim 11 further comprising a field layer above the first insulative layer.

16. The semiconductor device of claim 15 wherein the field layer comprises an oxide layer.

17. The semiconductor device of claim 11 wherein the voids form edges in the device level layer and in the first insulative layer, wherein the edges have positive profiles, and wherein the conductor is formed along the positive profiles.

\* \* \* \* \*